(12) United States Patent
Kwon

(10) Patent No.: US 8,836,068 B2
(45) Date of Patent: Sep. 16, 2014

(54) BACKSIDE ILLUMINATION IMAGE SENSOR AND ELECTRONIC SYSTEM INCLUDING THE BACKSIDE ILLUMINATION IMAGE SENSOR

(75) Inventor: Doo-Won Kwon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/106,369

(22) Filed: May 12, 2011

(65) Prior Publication Data
US 2011/0291219 A1 Dec. 1, 2011

(30) Foreign Application Priority Data

May 25, 2010 (KR) .................. 10-2010-0048600

(51) Int. Cl.
*H01L 21/00* (2006.01)
*H01L 27/146* (2006.01)
*H01L 31/062* (2012.01)

(52) U.S. Cl.
CPC ....... *H01L 27/1464* (2013.01); *H01L 27/14654* (2013.01); *H01L 27/14656* (2013.01); *H01L 27/14672* (2013.01); *H01L 27/14674* (2013.01); *H01L 31/062* (2013.01)
USPC ........................................ 257/447

(58) Field of Classification Search
CPC ............... H01L 27/1464; H01L 27/14654; H01L 27/14656; H01L 27/14672; H01L 27/14674; H01L 31/062
USPC .......................................... 257/447
See application file for complete search history.

(56) References Cited

U.S. PATENT DOCUMENTS

| 2006/0138322 A1* | 6/2006 | Costello et al. ............... 250/305 |
| 2009/0078978 A1* | 3/2009 | Rhodes ......................... 257/292 |
| 2009/0140365 A1* | 6/2009 | Lee et al. ....................... 257/460 |
| 2009/0189234 A1* | 7/2009 | Mabuchi ....................... 257/432 |
| 2009/0315132 A1* | 12/2009 | Kohyama ....................... 257/432 |

FOREIGN PATENT DOCUMENTS

| JP | 2008-066410 | 3/2008 |
| JP | 2008-294479 | 12/2008 |
| JP | 2006-261372 | * 4/2009 ............. H01L 27/14 |
| JP | 2009-088030 | 4/2009 |

OTHER PUBLICATIONS

Machine Translation of JP2006-261372.*
Machine Translation of JP2006-261372, previously included on PTO-892, on Apr. 15, 2013, is dated Apr. 2009.*

* cited by examiner

*Primary Examiner* — Kimberly Rizkallah
*Assistant Examiner* — Alexander Belousov
(74) *Attorney, Agent, or Firm* — Lee & Morse, P.C.

(57) ABSTRACT

A backside illumination image sensor, a method of fabricating the same, and an electronic system including the backside illumination image sensor, the backside illumination image sensor including a semiconductor substrate, the semiconductor substrate having an upper surface and a lower surface; photodiodes in the semiconductor substrate; and metal interconnections below the semiconductor substrate, wherein each of the photodiodes includes a N-type region, a lower P-type region below the N-type region, and an upper P-type region on the N-type region.

18 Claims, 10 Drawing Sheets

BACKSIDE ILLUMINATION IMAGE SENSOR AND ELECTRONIC SYSTEM INCLUDING THE BACKSIDE ILLUMINATION IMAGE SENSOR

CROSS REFERENCE TO RELATED APPLICATION

Korean Patent Application No. 10-2010-0048600, filed on May 25, 2010, in the Korean Intellectual Property Office, and entitled: "Backside Illumination Image Sensor Including P-Type Upper High-Concentration Region and Method of Fabricating the Same," is incorporated by reference herein in its entirety.

BACKGROUND

1. Field

Embodiments relate to a backside illumination image sensor, a method of fabricating the same, and an electronic system including the backside illumination image sensor.

2. Description of Related Art

To improve quantum efficiency of light, backside illumination image sensors having photodiodes formed within a semiconductor substrate have been suggested.

SUMMARY

Embodiments are directed to a backside illumination image sensor, a method of fabricating the same, and an electronic system including the backside illumination image sensor.

The embodiments may be realized by providing a backside illumination image sensor including a semiconductor substrate, the semiconductor substrate having an upper surface and a lower surface; photodiodes in the semiconductor substrate; and metal interconnections below the semiconductor substrate, wherein each of the photodiodes includes a N-type region, a lower P-type region below the N-type region, and an upper P-type region on the N-type region.

The backside illumination image sensor may further include isolation regions adjacent to the lower surface of the semiconductor substrate and between the photodiodes.

The upper P-type region may be adjacent to the upper surface of the semiconductor substrate, and the lower P-type region may be adjacent to the lower surface of the semiconductor substrate.

The upper P-type region may be continuously disposed on the photodiodes and between the photodiodes.

The upper P-type region may include a region doped at a higher concentration than the lower P-type region.

The upper P-type region may include a first P-type high-concentration region and a second P-type high-concentration region.

The first P-type high-concentration region may have a higher concentration than the lower P-type region and the second P-type high-concentration region.

The upper P-type region may further include a third P-type high-concentration region between the first and second P-type high-concentration regions, the third P-type high-concentration region having an intermediate concentration between concentrations of the first and second P-type high-concentration regions.

The first P-type high-concentration region may be adjacent to the upper surface of the semiconductor substrate, and the second P-type high-concentration region may be below the first P-type high-concentration region.

The embodiments may also be realized by providing a method of fabricating a backside illumination image sensor, the method including preparing a semiconductor substrate such that the semiconductor substrate has a first surface and a second surface; forming N-type regions in the semiconductor substrate; forming lower P-type regions in the semiconductor substrate; forming metal interconnections on the lower P-type regions; forming an upper P-type region in the semiconductor substrate; and forming color filters and microlenses on the second surface of the semiconductor substrate.

The method may further include forming isolation regions adjacent to the first surface of the semiconductor substrate such that each of the N-type regions is between the isolation regions.

The upper P-type region may be formed adjacent to the second surface of the semiconductor substrate, and the lower P-type regions may be formed adjacent to the first surface of the semiconductor substrate.

Forming the upper P-type region may include continuously forming the upper P-type region on the photodiodes and between the photo diodes.

Forming the upper P-type region may include forming a region doped at a higher concentration than the lower P-type region.

Forming the upper P-type region may include forming a first P-type high-concentration region and a second P-type high-concentration region.

The first P-type high-concentration region may have a higher concentration than the lower P-type region and the second P-type high-concentration region.

Forming the upper P-type region may further include forming a third P-type high-concentration region between the first and second P-type high-concentration regions.

The third P-type high-concentration region may have an intermediate concentration, the intermediate concentration being between concentrations of the first and second P-type high-concentration regions.

The first P-type high-concentration region may be formed adjacent to the second surface of the semiconductor substrate, and the second P-type high-concentration region may be formed below the first P-type high-concentration region.

The embodiments may also be realized by providing an electronic system including a bus, an imaging sensing unit in input/output communication with the bus, a central processing unit, and an input/output unit, wherein the image sensing unit includes a backside illumination image sensor of an embodiment.

BRIEF DESCRIPTION OF THE DRAWINGS

The embodiments will become more apparent to those of ordinary skill in the art by describing in detail exemplary embodiments with reference to the attached drawings, in which.

DETAILED DESCRIPTION

Figure 1A:
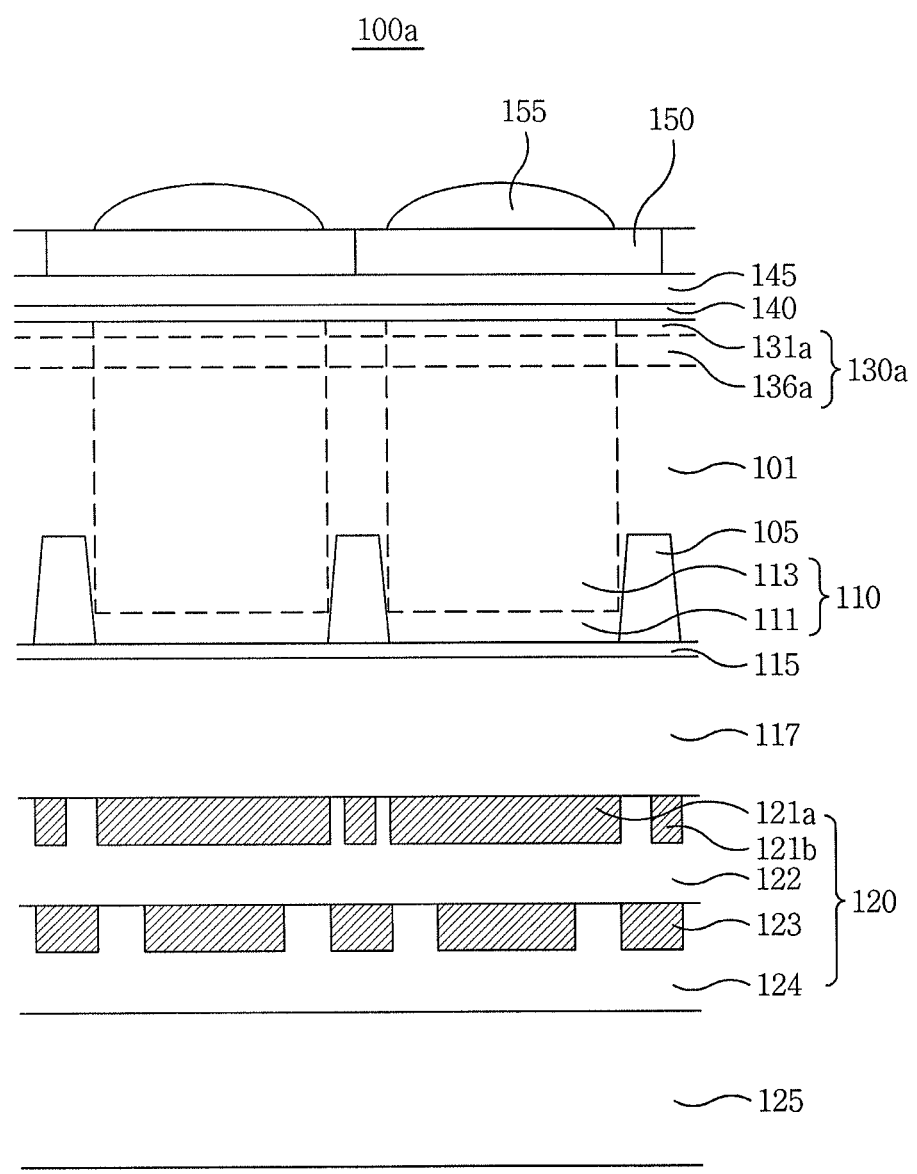
FIG. 1A illustrates a longitudinal cross-sectional view schematically showing a backside illumination image sensor according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "connected to" or "coupled to" another element or layer, it can be directly on, connected or coupled to the other element or layer or intervening elements or layers may be present. In contrast, when an element is referred to as being "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that a "concentration" herein may refer to a concentration of P-type impurity ions existing in a semiconductor substrate or other region.

FIG. 1A illustrates a longitudinal cross-sectional view schematically showing a backside illumination image sensor according to an embodiment. Referring to FIG. 1A, a backside illumination image sensor 100a may include photodiodes 110 at an upper portion thereof and metal interconnection layers 120 at a lower portion thereof.

The backside illumination image sensor 100a may include a semiconductor substrate 101, which may include an upper surface and a lower surface. The semiconductor substrate 101 may be a single crystalline silicon substrate into which P-type impurities are implanted at a relatively low concentration. Accordingly, a space between the photodiodes 110 may also be a region into which P-type impurities are implanted at a relatively low concentration.

Each of the photodiodes 110 may include an N-type region 113 and a P-type region. The P-type region may include lower P-type high-concentration regions 111 and upper P-type high-concentration regions 130a. The lower P-type and upper high-concentration regions 111 and 130a may be formed on lower regions and upper regions of the N-type region 113, respectively. For example, the lower P-type high-concentration region 111 may be formed on lower regions of, e.g., below, the N-type region 113; and the upper P-type high-concentration region 130a may be formed on, e.g., above, the N-type region 113. It may be understood that the lower and upper P-type high-concentration regions 111 and 130a may be regions into which P-type impurities are implanted at a relatively higher concentration than concentrations in other portions of the semiconductor substrate 101. In an implementation, the upper P-type high-concentration region 130a may include a region in which P-type impurities having a higher concentration than the lower P-type high-concentration region 111 are implanted.

The lower P-type high-concentration region 111 may be formed adjacent to or directly in contact with a lower surface of the semiconductor substrate 101 and may constitute a PN junction of the photodiode 110 with the N-type region 113.

The upper P-type high-concentration region 130a may be formed adjacent to or directly in contact with an upper surface of the semiconductor substrate 101 and may include a first P-type high-concentration region 131a and a second P-type high-concentration region 136a. In an implementation, the upper P-type high-concentration region 130a may be continuously formed between the photodiodes 110.

The first P-type high-concentration region 131a may have a depth of up to about 50 nm (from or relative to the upper surface of the semiconductor substrate 101). The second P-type high-concentration region 136a may have a depth of up to about 200 nm (from or relative to the upper surface of the semiconductor substrate 101). For example, the second P-type high-concentration region 136a may be formed deeper or have a greater depth than the first P-type high-concentration region 131a. In an implementation, the second P-type high-concentration region 136a may be below the first P-type high-concentration region 131a.

The first P-type high-concentration region 131a may have a higher concentration than a concentration of the second P-type high-concentration region 136a. For example, the first P-type high-concentration region 131a may include P-type impurity ions (including boron) at a concentration of about $1.0\times10^{18}$ to about $1.0\times10^{21}$ per unit volume; and the second P-type high-concentration region 136a may include P-type impurity ions (including boron) at a concentration of about $1.0\times10^{14}$ to about $5.0\times10^{19}$ per unit volume. The unit volume may refer to 1 cubic centimeter (1 cm$^3$).

When the upper P-type high-concentration region 130a is formed, performance of the photodiode 110 may be improved. For example, degradation of quantum efficiency of the photodiode 110 may be prevented or minimized and dark current and white pixel defects may be reduced.

The first P-type high-concentration region 131a may facilitate preventing or minimizing the degradation of quantum efficiency of the photodiode 110 and reducing the dark current. If the P-type upper high-concentration region 130a were to reduce the, e.g., size, of the N-type region 113 of the photodiode 110, the quantum efficiency of the photodiode 110 may be degraded. Accordingly, the first P-type high-concentration region 131a may be formed to a relatively shallow depth to thereby increase the P-type impurity concentration at the upper surface of the semiconductor substrate 101 and also to minimize the reduction of the N-type region 113 of the photodiode 110.

The second P-type high-concentration region 136a may facilitate reducing the white pixel defects of the photodiodes 110. The larger the volume or size of the N-type region 113 of the photodiode 110, the more increased or pronounced the white pixel defects may be. Therefore, the second P-type high-concentration region 136a may adjust the volume or size of the N-type region 113 of the photodiode 110 to reduce the white pixel defects.

Accordingly, as the upper P-type high-concentration region 130a may be formed in a multi-layer structure, it may advantageously minimize degradation of the quantum efficiency and reduce the dark current and the white pixel defects. Therefore, the embodiments may include the P-type upper high-concentration region 130a having a multi-layer structure. Accordingly, although the upper P-type high-concentration region 130a are illustrated in the drawing figures as having a, e.g., two- or three-layer structure, the embodiments are not limited thereto, and it should be understood that the upper P-type high-concentration region 130a may be formed in a multi-layer structure of, e.g., four or more layers.

The backside illumination image sensor 100a may further include color filters 150 and microlenses 155 formed over the photodiodes 110, e.g., over the upper surface of the semiconductor substrate 101.

The backside illumination image sensor 100a may further include an anti-reflection layer 140 and/or an insulating layer 145 between the photodiodes 110 and the color filters 150. The anti-reflection layer 140 and the insulating layer 145 may also be referred to as a backside anti-reflection layer 140 and a backside insulating layer 145. The anti-reflection layer 140 may include, e.g., silicon nitride or silicon oxynitride. The insulating layer 145 may include, e.g., silicon oxide.

The backside illumination image sensor 100a may further include isolation regions 105 between the photodiodes 110. The isolation regions 105 may be adjacent to the lower surface of the semiconductor substrate 11 and may be formed in a shallow trench isolation (STI) structure.

The backside illumination image sensor 100a may further include a stopper layer 115 and an interlayer insulating layer 117 below the photodiodes, e.g., on the lower surface of the semiconductor substrate 101. The stopper layer 115 may include, e.g., silicon nitride or silicon oxynitride. The interlayer insulating layer 117 may include, e.g., silicon oxide.

The backside illumination image sensor 100a may further include the metal interconnection layer 120 below the interlayer insulating layer 117. The metal interconnection layer 120 may include upper metal interconnections 121a and 121b and a lower metal interconnection 123. The metal interconnection 121a of the upper metal interconnections 121a and 121b (which may be aligned with a corresponding photodiode 110) may serve as a backside reflection layer. The upper metal interconnections 121a and 121b may be surrounded by an upper inter-metal insulating layer 122; and the lower metal interconnection 123 may be surrounded by a lower inter-metal insulating layer 124. The upper and lower inter-metal insulating layers 122 and 124 may include, e.g., silicon oxide.

The backside illumination image sensor 100a may further include a supporting layer 125 below the metal interconnection layer 120. The supporting layer 125 may be formed by attaching a sustain wafer. For example, the supporting layer 125 may include a separate wafer, such as a semiconductor substrate.

Figure 1B:
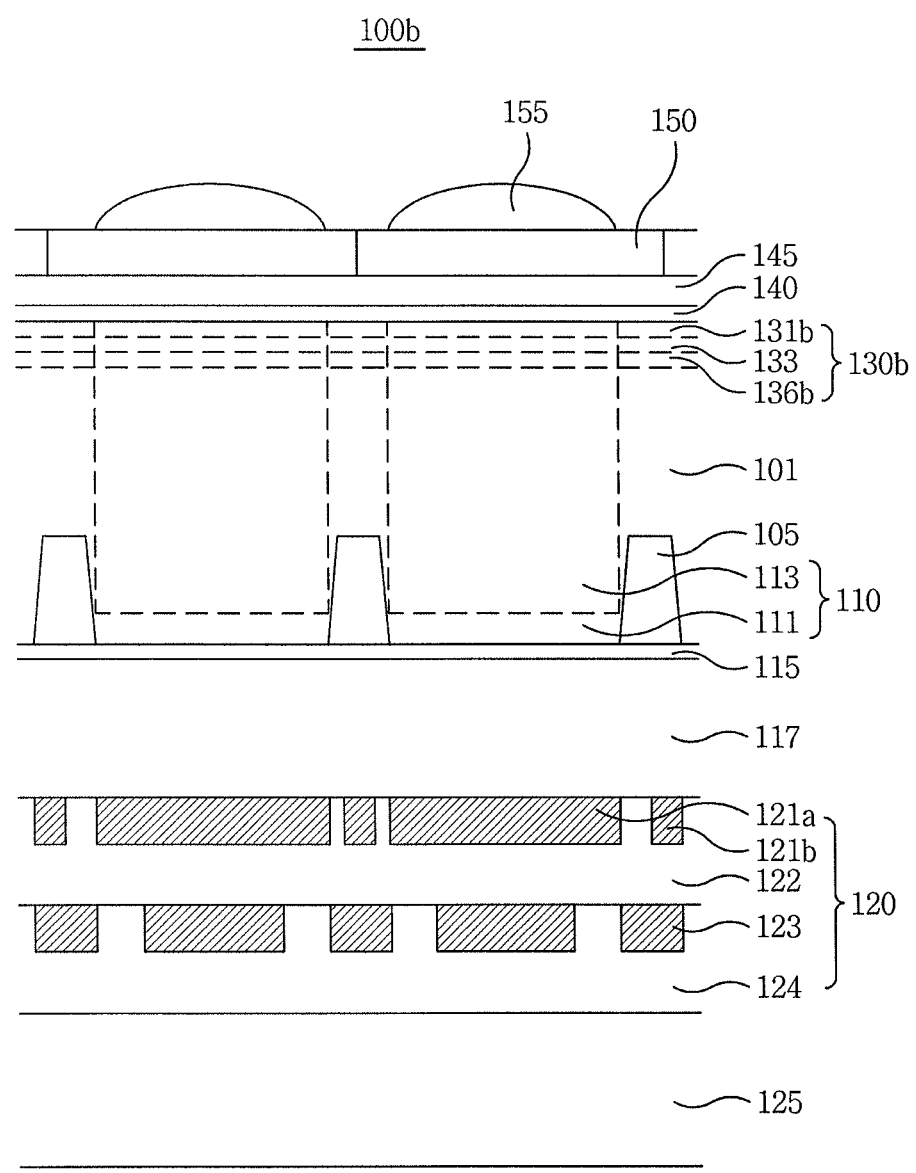
FIG. 1B illustrates a longitudinal cross-sectional view schematically showing a backside illumination image sensor according to another embodiment.

FIG. 1B illustrates a longitudinal cross-sectional view schematically showing a backside illumination image sensor according to another embodiment. Referring to FIG. 1B, a backside illumination image sensor 100b may include an upper P-type high-concentration region 130b, which may be formed of three or more layers. The upper P-type high-concentration region 130b may include a first P-type high-concentration region 131b, a second P-type high-concentration region 136b, and a third P-type high-concentration region 133. The third P-type high-concentration region 133 may have a middle or intermediate concentration (relative to concentrations of the first and second P-type high-concentration regions 131b and 136b). In an implementation, the third P-type high-concentration region 133 may have the same concentration as the first P-type high-concentration region 131a of FIG. 1A; and the first P-type high-concentration region 131b may have a higher concentration than the first P-type high-concentration region 131a of FIG. 1A. Thus, the upper P-type high-concentration regions 130a and 130b (illustrated in FIGS. 1A and 1B) may include multi-layered P-type high-concentration regions 131a and 131b, 133, 136a, and 136b (which may have a stepwise concentration distribution).

Hereinafter, a method of fabricating a backside illumination image sensor according to an embodiment will be described.

Figure 2A:
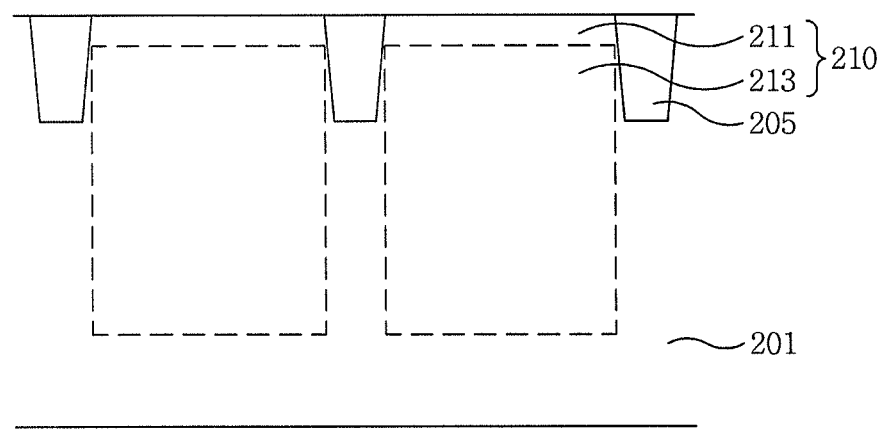
FIGS. 2A to 2G illustrate longitudinal cross-sectional views schematically showing stages in a method of fabricating a backside illumination image sensor according to an embodiment.

Referring to FIG. 2A, isolation regions 205 and photodiodes 210 may be formed in a semiconductor substrate 201. The isolation regions 205 may be formed using, e.g., a shallow trench isolation (STI) technique. Each of the photodiodes 210 may include a P-type region 211 and an N-type region 213. The P-type region 211 may be formed to be relatively shallow at a position close to a surface of the substrate 201. The P-type region 211 may be doped at a first concentration. The N-type region 213 may be formed to be relatively deep within the semiconductor substrate 201. The semiconductor substrate 201 may include a P-type substrate. For example, the semiconductor substrate 201 may include P-type impurities (which may be doped at a relatively low concentration on the whole, e.g., throughout the semiconductor substrate 201). Thus, a region of the semiconductor substrate 201 between the N-type regions 213 of the photodiode 210 may be a region doped with P-type impurities. The P-type region 211 may be a region doped with P-type impurities having a higher concentration than the semiconductor substrate 201.

Figure 2B:
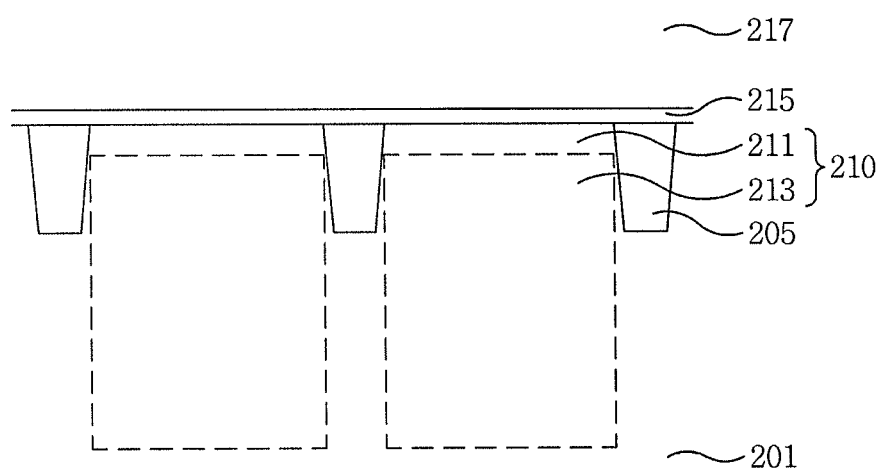

Referring to FIG. 2B, a stopper layer 215 and an interlayer insulating layer 217 may be formed on the surface of the semiconductor substrate 201. The stopper layer 215 may be formed to be relatively thin and may include silicon nitride. The interlayer insulating layer 217 may be formed to be relatively thick and may include silicon oxide. Various transistors, e.g., a transfer transistor, a reset transistor, an amplification transistor, etc., may be formed at a same level or plane as the interlayer insulating layer 217. The stopper layer 215 may provide convenience when several patterns are formed in the interlayer insulating layer 217.

Figure 2C:
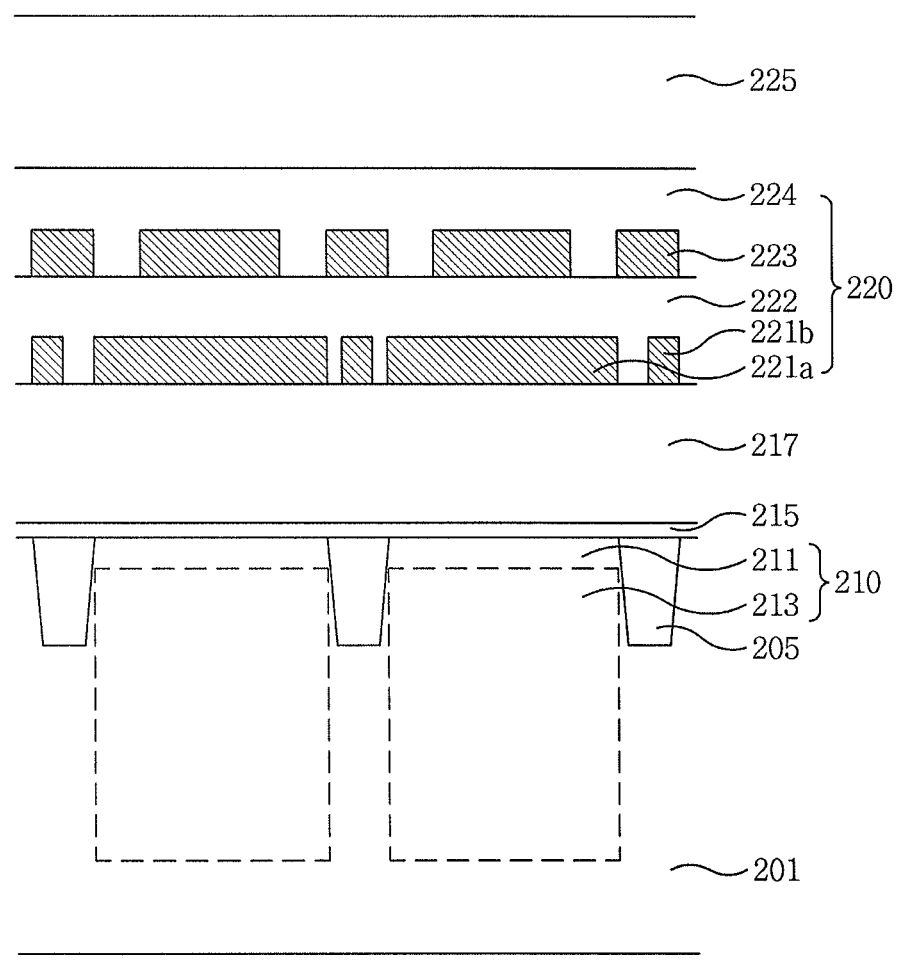

Referring to FIG. 2C, a metal interconnection layer 220 may be formed on the interlayer insulating layer 217. The metal interconnection layer 220 may include lower metal interconnections 221a and 221b, a lower insulating layer 222, an upper metal interconnection 223, and an upper insulating layer 224. The lower metal interconnection 221a (which may be aligned with the photodiode 210) may reflect light passing through the photodiode 210. For example, the lower metal interconnection 221a (which may be aligned with the photodiode 210) may be a backside reflective layer. The lower and upper insulating layers 222 and 224 may be formed of, e.g., silicon oxide. A silicon nitride layer may be further formed between the lower and upper insulating layers 222 and 224. Then, a sustain wafer 225 may be attached to the metal interconnection layer 220.

Figure 2D:
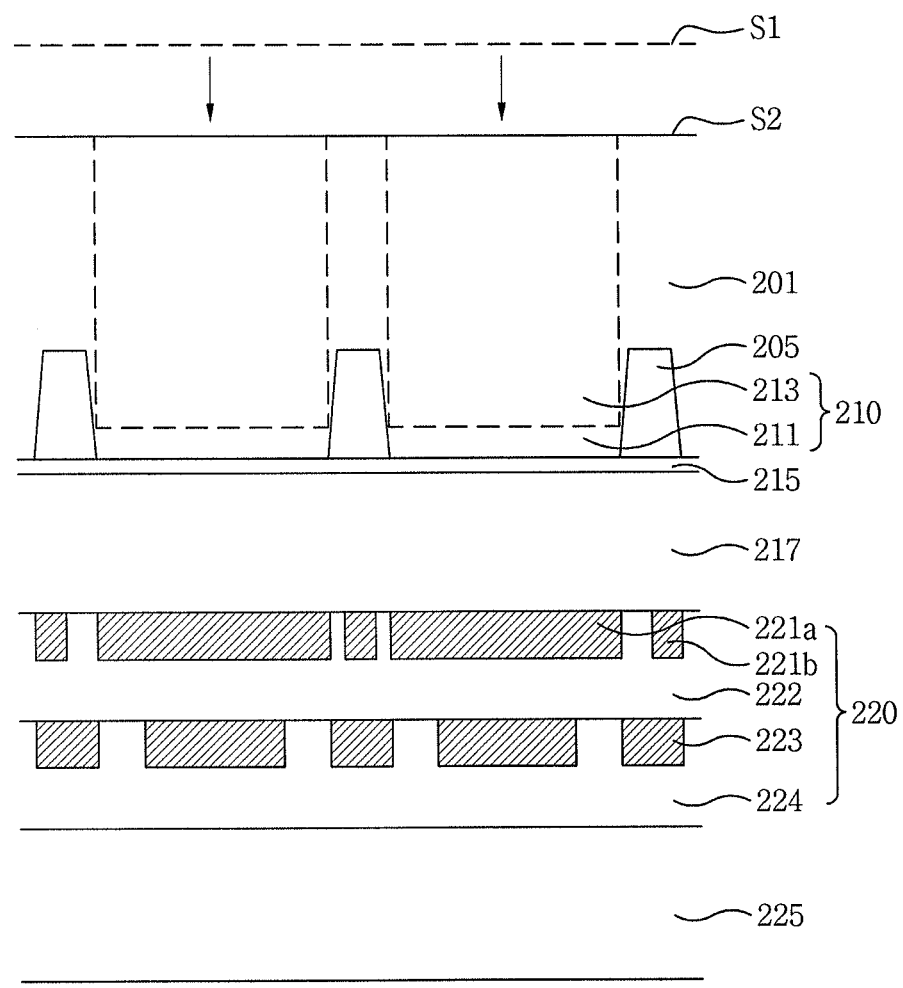

Referring to FIG. 2D, a portion of a backside of the semiconductor substrate 201 may be removed. For example, the semiconductor substrate 201 may be thinned. The thinning process may include, e.g., a grinding process or an etching process. During the thinning process, the backside of the semiconductor substrate 201 may be changed from a first surface position S1 to a second surface position S1. FIG. 2D illustrates a view in which the structure of FIG. 2C is vertically reversed, i.e., is upside-down.

Figure 2E:
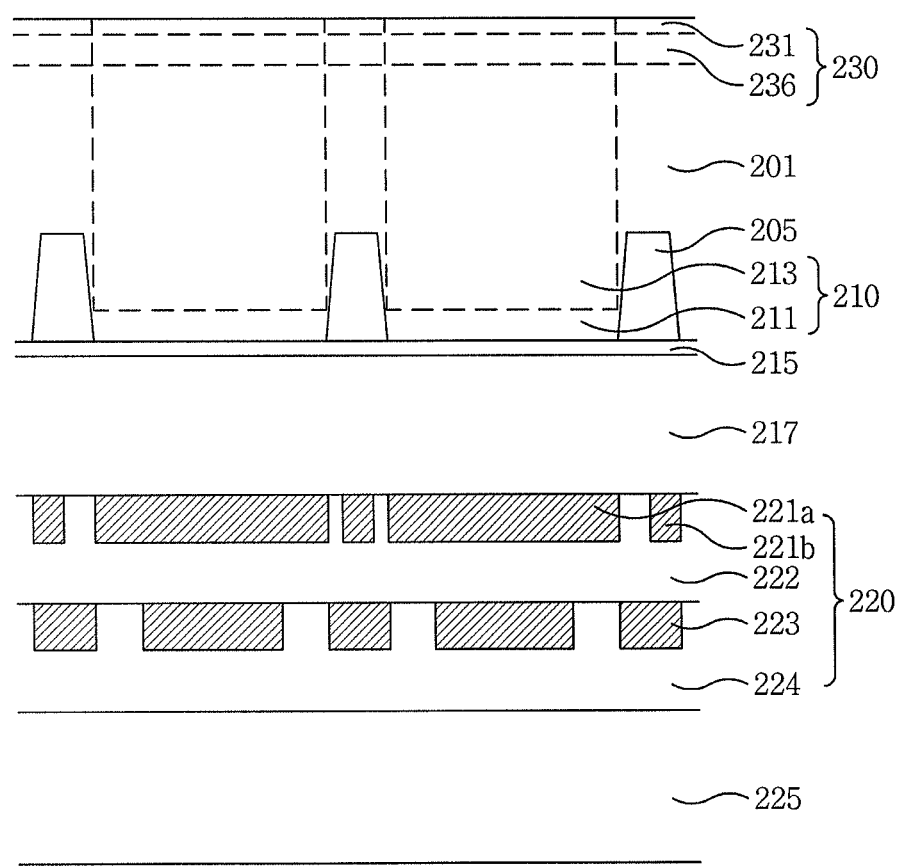

Referring to FIG. 2E, an upper P-type region 230 may be formed in the semiconductor substrate 201. The P-type upper region 230 may include a first P-type high-concentration region 231 and a second P-type high-concentration region 236. A method of forming the first and second P-type high-concentration regions 231 and 236 will be described in more detail below.

First, impurity ions may be implanted into the semiconductor substrate 201. The impurity ions may include, e.g., boron ions. Implanting the impurity ions may be performed by using, e.g., an ion implantation process or a pulsed plasma doping process. The ion implantation process may be a process that accelerates the impurity ions to be implanted into the semiconductor substrate 201 using an electric field. The pulsed plasma doping process may be a process that excites the impurity ions to be implanted into the semiconductor substrate 201 in a plasma state. The pulsed plasma doping process may include forming an impurity layer at the surface of the semiconductor substrate 201 and diffusing impurity ions of the impurity layer into the semiconductor substrate 201. In the pulsed plasma doping process, any one of, e.g., boron fluoride ($BF_3$), diborane ($B_2H_6$), and B and H-containing compounds, may be used as a source gas of the impurity ion. For example, the pulsed plasma doping process may be performed at a dose of about $1.0 \times 10^{13}$ to about $1.0 \times 10^{18}$ atoms/cm$^2$ and an energy of about 1 keV to about 7 keV.

For example, the first P-type high-concentration region 231 may not be deeply formed (relative to the surface of the semiconductor substrate 201) so that the impurity ions may be implanted at a relatively lower energy. Accordingly, the impurity ions may be implanted into the semiconductor substrate 201 using an ion implantation process to form the first P-type high-concentration region 231. On the other hand, the second P-type high-concentration region 236 may extend deeply (relative to the surface of the semiconductor substrate 201) so that the impurity ions may be implanted at a relatively higher energy. Accordingly, the impurity ions may be implanted into the semiconductor substrate 201 using the pulsed plasma doping process to form the second P-type high-concentration region 236. This is because the ion implantation process of a high energy may damage the surface of the semiconductor substrate 201.

A region in which the implanted impurity ions are distributed may be annealed using a laser. A blue gas laser using xenon chloride (XeCl) or a green laser using Nd:YAG or Nd:YVO$_4$ (which is a diode pumped solid state (DPSS) laser) may be used for the annealing process. The laser annealing process may be separately performed with respect to the first and second P-type high-concentration regions 231 and 236. For example, the annealing process may include applying an instant energy of a pulse type at a temperature higher than a melting point of silicon. For example, the silicon may be instantly melted so that the annealing effect may be obtained. Typically, after the impurity ions are implanted, the annealing process is accompanied so as to diffuse the implanted impurity ions. A typical thermal annealing process may have a relatively long annealing time so that the impurity-implanted region may be formed larger than necessary. On the contrary, the laser annealing process according to an embodiment may have a relatively very short annealing time so that the impurity-implanted region may not be formed larger than necessary. Accordingly, the impurity implanted region may be formed have a suitable concentration and a desired size.

All the first and second P-type high-concentration regions 231 and 236 may be regions doped with the P-type impurity ions, e.g., boron. The second P-type high-concentration region 236 may extend more deeply than the first P-type high-concentration region 231 relative to the surface of the semiconductor substrate 201. The first P-type high-concentration region 231 may be formed closer to the surface of the semiconductor substrate 201 than the second P-type high-concentration region 236. The first P-type high-concentration region 231 may have a higher concentration than the second P-type high-concentration region 236. For example, the P-type impurity ions may be implanted into the second P-type high-concentration region 236 at about $1.0 \times 10^{14}$ to about $1.0 \times 10^{19}$ per unit volume; whereas the P-type impurity ions may be implanted into the first P-type high-concentration region 231 at about $1.0 \times 10^{18}$ to about $5.0 \times 10^{21}$ per unit volume. The unit volume may be 1 cubic centimeter (1 cm$^3$). In the concentration range overlapping each other, it is only efficient that the first P-type high-concentration region is doped at a higher concentration than the second P-type high-concentration region 236.

Figure 2F:
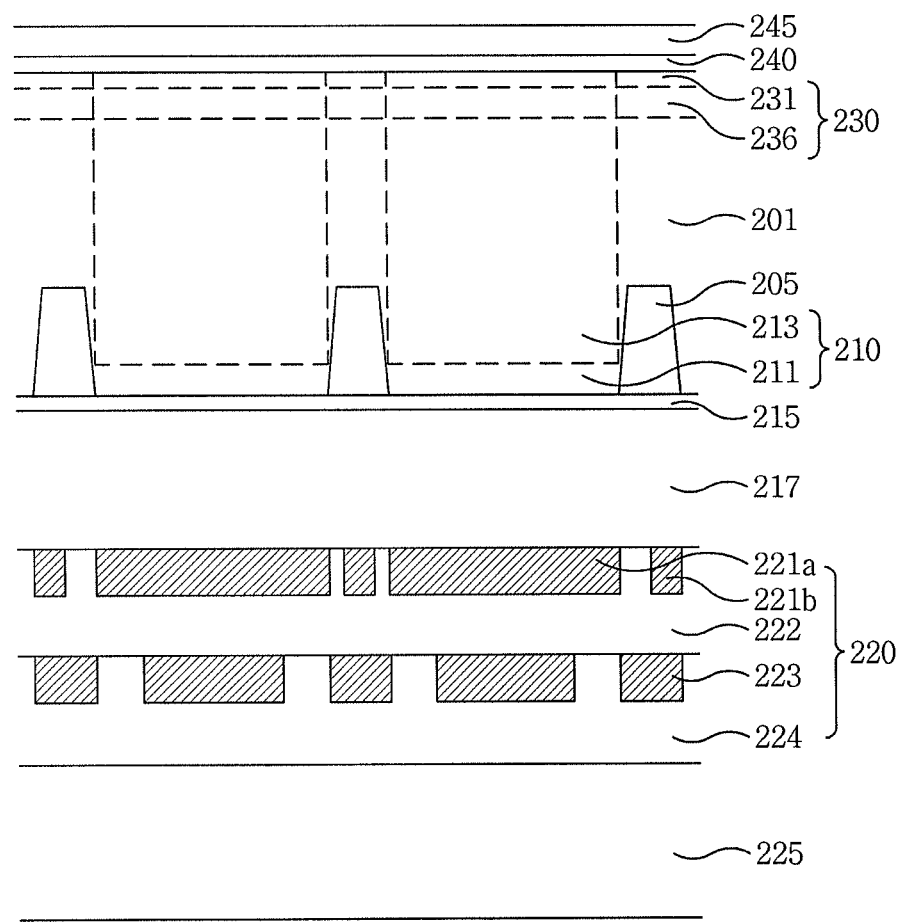

Referring to FIG. 2F, a backside antireflection layer 240 and a backside insulating layer 245 may be formed. The backside antireflection layer 240 may prevent light from inversely reflecting from the photodiode 210 or may alleviate light inversely reflected from the photodiode 210 and may serve as a stopper. The backside antireflection layer 240 may include, e.g., silicon nitride or silicon oxynitride. The backside insulating layer 245 may include, e.g., silicon oxide. Backside pads (not illustrated) may be formed at the same level or plane as the backside insulating layer 245.

Figure 2G:
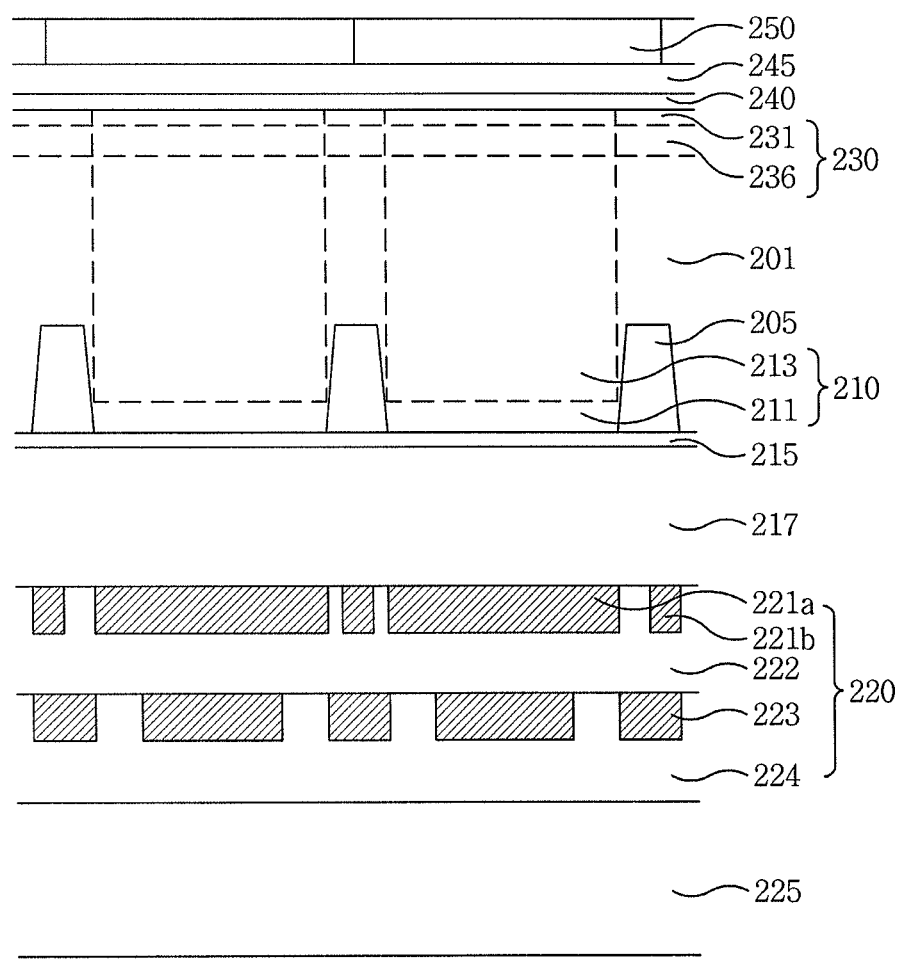

Referring to FIG. 2G, color filters 250 and microlenses (not shown) may be formed on the backside insulating layer 245. The color filters 250 may selectively transmit red (R), green (G), and blue (B) light. The microlenses may be formed of an organic material. Accordingly, the backside illumination image sensor according to an embodiment may be completed.

Figure 3A:
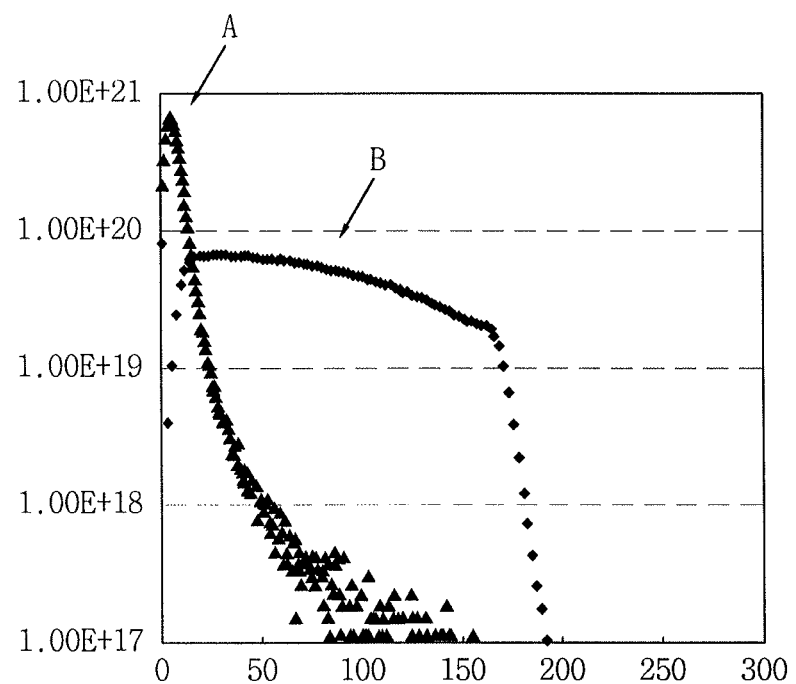
FIGS. 3A and 3B illustrate SIMS measurement graphs of a P-type upper high-concentration region included in a backside illumination image sensor according to an embodiment.

FIG. 3A illustrates a second ion mass spectroscopy (SIMS) measurement graph of a P-type upper high-concentration region included in a backside illumination image sensor according to an embodiment. The horizontal axis denotes a depth from a surface of a semiconductor substrate and the vertical axis denotes an impurity ion concentration. Referring to FIG. 3A, a curve A represents a distribution graph of P-type impurity ions after a P-type impurity ion implantation process is performed Curve B represents a distribution graph of the P-type impurity ions after an annealing process is performed. For example, the P-type impurity ions may be implanted using an ion implantation process or a pulsed plasma doping process to form the curve A. Then, the P-type impurity ions implanted as shown in the curve B may be diffused into the semiconductor substrate using a laser annealing process. For example, referring to the curve A, the ion implantation process may be performed such that a peak point of the P-type impurity ion concentration is formed at a region spaced about 10 nm from the surface of the semiconductor substrate. Referring to the curve B, the annealing process may be performed such that a region spaced about 30 nm to about 170 nm from the surface of the semiconductor substrate is set to a high-concentration region or an average concentration region. The graph is illustrated to readily describe the embodiments; and the curve B may be formed in various shapes according to the annealing process condition. For example, the curve B may be formed like the curve A or varied more significantly than the B curve. It may be variously modified according to the intention of a user to embody the embodiments.

Figure 3B:
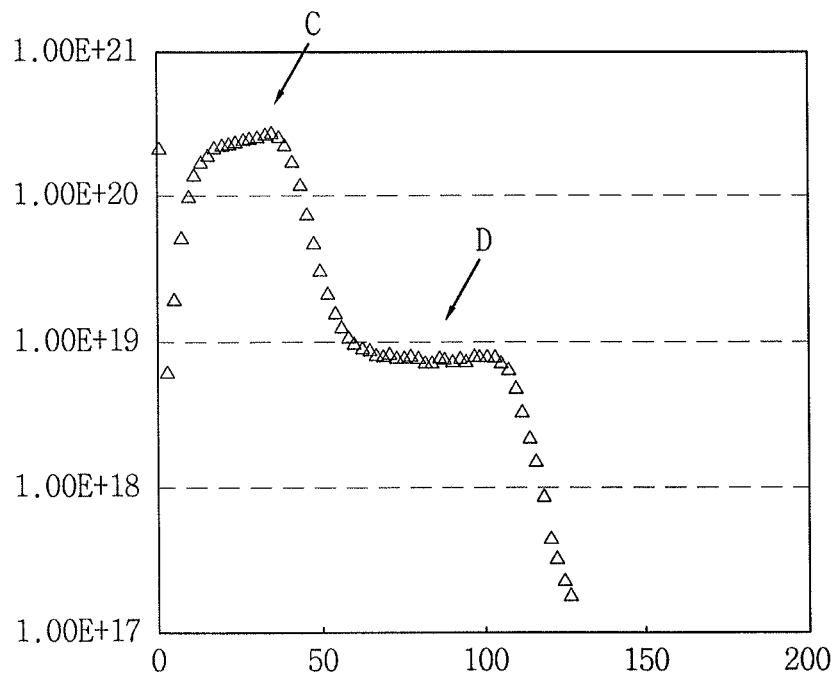

FIG. 3B illustrates an illustrative result measurement graph of the embodiments. The horizontal axis denotes a depth from a surface of a semiconductor substrate and the vertical axis denotes an impurity ion concentration. Referring to FIG. 3B, it is noted that the upper P-type high-concentration region is distributed at a first high-concentration at a position within about 50 nm from the surface of the semiconductor substrate (in a region C) and distributed at a second high-concentration at a position spaced about 50 nm to about 100 nm from the surface of the semiconductor substrate (in a region D). For example, it is noted that the first high-concentration is about $1.0 \times 10^{20}$ to about $1.0 \times 10^{21}$ and the second high-concentration is below about $1.0 \times 10^{19}$. Depths of the regions C and D may be variously set according to the properties of the device. Referring to FIGS. 3A and 3B, the P-type upper high-concentration region may be formed in various shapes, for example various P-type impurity ion concentrations, various P-type impurity ion distributions, various formation depths and/or widths of the P-type ions, etc.

Figure 4:
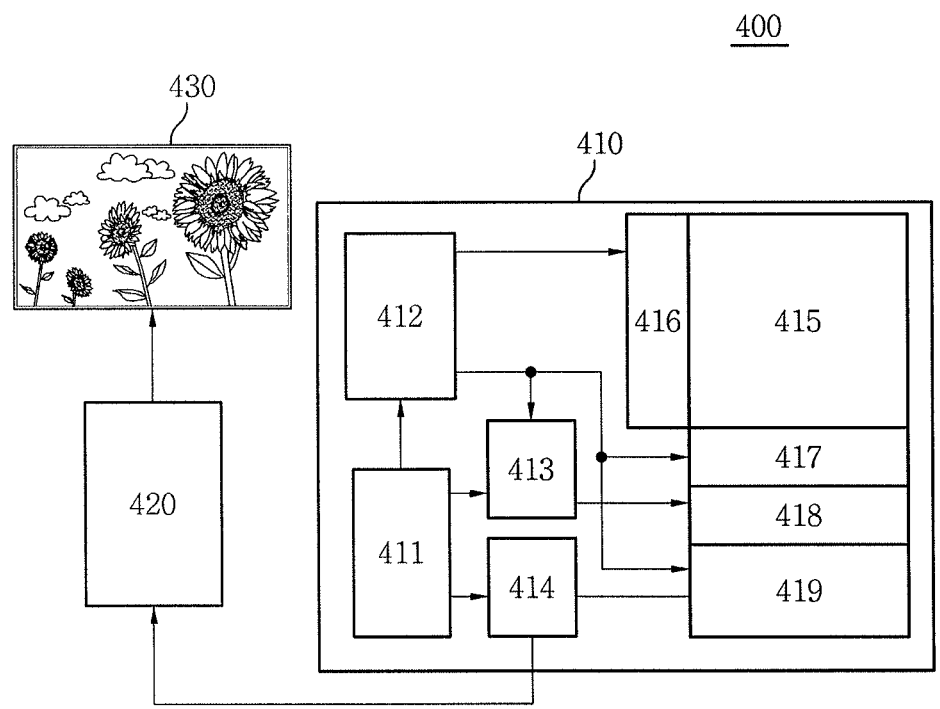
FIG. 4 illustrates a block diagram schematically showing a camera system including a backside illumination image sensor according to an embodiment.

FIG. 4 illustrates a block diagram schematically showing a camera system including a backside illumination image sensor according to an embodiment. Referring to FIG. 4, a camera system according to an embodiment may include an image sensing unit 410, an image signal processing unit 420, and an image display unit 430. The image sensing unit 410 may include a control register block 411, a timing generator 412, a lamp generator 413, a buffer unit 414, an active pixel sensor array 415, a row driver 416, a correlation double sampler 417, a comparing unit 418, and an analog-digital converter (ADC) 419. The control register block 411 may totally control an operation of the image sensor 400. For example, the control register block 411 may directly transmit an operation signal to the timing generator 412, the lamp generator 413, and the buffer unit 414. The timing generator 412 may generate signals that are a reference of the operation timing of several construction elements of the image sensing unit 410. The operation timing reference signals generated by the timing generator 412 may be provided to the lamp generator 413, the row driver 416, the correlation double sampler 417, and/or the ADC 419. The lamp generator 413 may generate a lamp signal used in the correlation double sampler 417 and/or the comparing unit 418 and may transmit the lamp signal to the comparing unit 418. The buffer unit 414 may include a latch unit. The buffer unit 414 may temporarily store an image signal to be transmitted to the outside. The active pixel sensor array 415 may sense an external image signal. The active pixel sensor array 415 may include a plurality of active pixel sensors; and each of the active pixel sensors may include a backside illumination image sensor according to an embodiment. The row driver 416 may selectively activate rows of the active pixel sensor array 415. The correlation double sampler 417 may sample an analog signal generated from the active pixel sensor array 415 and output the sampled analog signal. The comparing unit 418 may compare data transmitted from the correlation double sampler 417 and a slope of the lamp signal fed back according to analog reference voltages to generate various reference signals. The ADC 419 may convert analog image data into digital image data.

Figure 5:
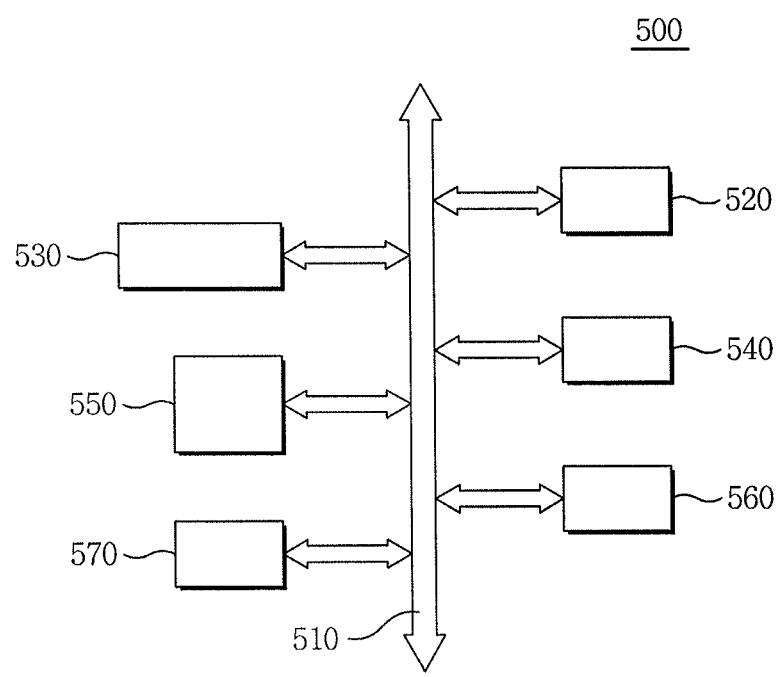
FIG. 5 illustrates a block diagram schematically showing an electronic system including a backside illumination image sensor according to an embodiment.

Referring to FIG. 5, an electronic system 500 according to an embodiment may include a bus 510, an image sensing unit 520 configured to communicate by inputting/outputting through the bus 510, a central processing unit (CPU) 530, and an input/output unit 540. The electronic system 500 may further include a memory drive 550. The electronic system 500 may further include an optical disc drive (ODD) 560. The electronic system 500 may further include an external communication unit 570. The image sensing unit 520 may include a backside illumination image sensor according to an embodiment. The CPU 530 may include a microprocessor. The input/output unit 540 may include any one of various input elements, e.g., a button, a switch, a key board, a mouse, a key pad, a touch pad, a scanner, a camera, a photo sensor, etc., or any one of an LCD, an LED, and/or a CRT monitor, a printer, and/or a display device displaying various kinds of visual information. The memory drive 550 may include DRAM (dynamic random access memory), SRAM (static random access memory), PRAM (phase changeable random access memory), RRAM (resistive random access memory), MRAM (magnetic random access memory), NVM (non-volatile memory), FLASH, SSD (solid state disk), HD (hard disk) and/or various memory devices or drives thereof. The optical disc drive 560 may include for example, a CD-ROM drive, a DVD drive, etc. The external communication unit 570 may include modems, LAN cards, or USBs (universal serial buses) and include external memories, WiBro communication devices, infrared ray communication devices, etc.

The names and functions of construction elements in drawings which are not labeled by reference numeral or which are only labeled by reference numerals will be readily understood from those of other drawings and the descriptions thereof.

The backside illumination image sensor according to an embodiment may minimize degradation of quantum efficiency and dark current and white pixel defects may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What us claimed is:

1. A backside illumination image sensor, comprising:
a semiconductor substrate, the semiconductor substrate having an upper surface and a lower surface;
photodiodes in the semiconductor substrate;
isolation regions adjacent to the lower surface of the semiconductor substrate and between the photodiodes, and
metal interconnections below the semiconductor substrate, wherein:
each of the photodiodes includes:
an N-type region,
a lower P-type region below the N-type region, and
an upper P-type region on the N-type region,
the upper P-type region includes at least a first P-type high-concentration region in direct physical contact with a second P-type high-concentration region,
the upper P-type region has a stepwise concentration distribution of impurities between the first and second P-type high-concentration regions,
the second P-type high-concentration region is directly on the N-type region,
the first P-type high-concentration region and the second P-type high-concentration region are continuously disposed on the N-type region and between the photodiodes, and both the first P-type high-concentration region and the second P-type high-concentration region extend horizontally continuously to be parallel with the upper surface of the semiconductor substrate, respectively, and wherein the second P-type high-concentration region is not in contact with the isolation regions.

2. The backside illumination image sensor as claimed in claim 1, wherein:
the upper P-type region is adjacent to the upper surface of the semiconductor substrate, and the lower P-type region is adjacent to the lower surface of the semiconductor substrate.

3. The backside illumination image sensor as claimed in claim 1, wherein
the upper P-type region includes a region doped at a higher concentration than the lower P-type region.

4. The backside illumination image sensor as claimed in claim 1, wherein:
the first P-type high-concentration region has a higher concentration than the lower P-type region and the second P-type high-concentration region,
the second P-type high-concentration region has a higher concentration than the lower P-type region.

5. An electronic system, comprising:
a bus;
an imaging sensing unit in input/output communication with the bus;
a central processing unit; and
an input/output unit, wherein the image sensing unit includes a backside illumination image sensor as claimed in claim 1.

6. The backside illumination image sensor as claimed in claim 1, wherein:
the first P-type high-concentration region extends to a depth of up to 50 nm from an upper surface of the semiconductor substrate, and
the second P-type high-concentration region extends from the first P-type high-concentration region to a depth of up to 200 nm from the upper surface of the semiconductor substrate.

7. The backside illumination image sensor as claimed in claim 1, wherein the first and second P-type high-concentration regions are spaced apart from the isolation regions.

8. The backside illumination image sensor as claimed in claim 7, wherein the first and second P-type high-concentration regions are continuously disposed above the isolation regions.

9. The backside illumination image sensor as claimed in claim 1, wherein:
the first P-type high-concentration region has a first thickness,
the second P-type high-concentration region has a second thickness greater than the first thickness, and
the second P-type high-concentration region is closer to the N-type region than the first P-type high-concentration region.

10. A backside illumination image sensor, comprising:
a semiconductor substrate, the semiconductor substrate having an upper surface and a lower surface;
photodiodes in the semiconductor substrate;
isolation regions adjacent to the lower surface of the semiconductor substrate and between the photodiodes, and
metal interconnections below the semiconductor substrate, wherein each of the photodiodes includes:
an N-type region, a lower P-type region below the N-type region, and an upper P-type region on the N-type region,
wherein the upper P-type region includes at least a first P-type high-concentration region in direct physical contact with a second P-type high-concentration region,
wherein the upper P-type region has a stepwise concentration distribution of impurities between the first and second P-type high-concentration regions,
wherein the second P-type high-concentration region is directly on the N-type region, wherein the upper P-type region further includes a third P-type high-concentration region between the first and second P-type high-concentration regions, the third P-type high-concentration region having an intermediate concentration between concentrations of the first and second P-type high-concentration regions, wherein all of the first P-type high-concentration region, the second P-type high-concentration region, and the third P-type high-concentration region extend horizontally continuously to be parallel with the upper surface of the semiconductor substrate, respectively, and wherein the second P-type high-concentration region is not in contact with the isolation regions.

11. The backside illumination image sensor as claimed in claim 10, wherein:

the first P-type high-concentration region is adjacent to the upper surface of the semiconductor substrate, and the second P-type high-concentration region is below the first P-type high-concentration region.

12. The backside illumination image sensor as claimed in claim 10, wherein the first, second, and third P-type high-concentration regions are continuously disposed on the N-type region and between the photodiodes.

13. The backside illumination image sensor as claimed in claim 12, wherein the first, second, and third P-type high-concentration regions are continuously disposed above the isolation regions.

14. The backside illumination image sensor as claimed in claim 10, wherein the concentration of the second P-type high-concentration region is greater than a concentration of the lower P-type region.

15. A backside illumination image sensor, comprising:

a semiconductor substrate, the semiconductor substrate having an upper surface and a lower surface;

N-type regions and isolation regions in the semiconductor substrate, wherein the isolation regions are disposed between the N-type regions and adjacent to the lower surface;

a lower P-type region between the N-type region and the lower surface;

an upper P-type region between the N-type region and the upper surface;

wherein the upper P-type region includes a first P-type high-concentration region adjacent to the upper surface, a second P-type high-concentration region adjacent to the N-type region, and a third P-type high-concentration region between and in direct physical contact with the first P-type high-concentration region and the second P-type high-concentration region, wherein the upper P-type region has a stepwise concentration distribution of impurities among the first, third, and second P-type high-concentration regions, wherein the second P-type high-concentration region is directly on the N-type region, wherein the first, second, and third P-type high-concentration regions are continuously disposed on the N-type regions and the isolation regions, wherein all of the first P-type high-concentration region, the second P-type high-concentration region, and the third P-type high-concentration region extend horizontally continuously to be parallel with the upper surface of the semiconductor substrate, respectively, and wherein at least the second P-type high-concentration region is not in contact with the isolation regions.

16. The backside illumination image sensor as claimed in claim 15, wherein:

the first P-type high-concentration region has a higher concentration than the second P-type high-concentration region, and the third P-type high-concentration region has a lower concentration than the second P-type high-concentration region.

17. The backside illumination image sensor as claimed in claim 16, wherein the first, second, and third P-type high-concentration regions are spaced apart from the isolation regions.

18. The backside illumination image sensor as claimed in claim 15, wherein the concentration of the second P-type high-concentration region is greater than a concentration of the lower P-type region.

* * * * *